United States Patent
Kropp

(10) Patent No.: US 7,364,368 B2
(45) Date of Patent: Apr. 29, 2008

(54) OPTOELECTRONIC COUPLING ARRANGEMENT AND TRANSCEIVER WITH SUCH AN OPTOELECTRONIC COUPLING ARRANGEMENT

(75) Inventor: Jorg-Reinhardt Kropp, Berlin (DE)

(73) Assignee: Finisar Corporation, Sunnyvale, CA (US)

(*) Notice: Subject to any disclaimer, the term of this patent is extended or adjusted under 35 U.S.C. 154(b) by 17 days.

(21) Appl. No.: 11/035,789

(22) Filed: Jan. 13, 2005

(65) Prior Publication Data
US 2005/0254758 A1    Nov. 17, 2005

Related U.S. Application Data

(60) Provisional application No. 60/571,363, filed on May 14, 2004.

(51) Int. Cl.
*G02B 6/36* (2006.01)
(52) U.S. Cl. .......................................... 385/89; 385/93
(58) Field of Classification Search ............ 385/88–94
See application file for complete search history.

(56) References Cited

U.S. PATENT DOCUMENTS

| 6,312,624 | B1 | 11/2001 | Kropp |
| 6,457,875 | B1 | 10/2002 | Kropp et al. |
| 6,767,140 | B2* | 7/2004 | Pendse et al. ............... 385/89 |
| 6,916,121 | B2* | 7/2005 | Mazotti et al. ............. 385/88 |
| 6,939,058 | B2* | 9/2005 | Gurevich et al. ........... 385/93 |
| 2005/0062123 | A1* | 3/2005 | Weigert ..................... 257/433 |

FOREIGN PATENT DOCUMENTS

| DE | 197 11 138 A1 | 9/1998 |
| DE | 197 42 895 A1 | 4/1999 |

\* cited by examiner

*Primary Examiner*—Tina Wong
(74) *Attorney, Agent, or Firm*—Workman Nydegger

(57) ABSTRACT

An optoelectronic coupling arrangement including a package with electrical terminals, integrated in which are at least one optoelectronic transmitting component and at least one optoelectronic receiving component, which are encapsulated in the package with a non-transparent casting material; and an optomechanical coupling block, which includes a transparent plastic and integrated in which are mechanical aligning structure for attaching an optical connector. In this case, the optomechanical coupling block is connected to the package and at least two optical channels are provided in the package and the optomechanical coupling block for coupling light on the one hand between the at least one optoelectronic transmitting component and an optical connector to be attached and on the other hand between the at least one optoelectronic receiving component and an optical connector to be attached. Furthermore, the invention relates a transceiver with such an optoelectronic coupling arrangement.

28 Claims, 4 Drawing Sheets

OPTOELECTRONIC COUPLING ARRANGEMENT AND TRANSCEIVER WITH SUCH AN OPTOELECTRONIC COUPLING ARRANGEMENT

RELATED APPLICATION

The present application claims priority of U.S. Patent Application Ser. No. 60/571,363 filed by Jorg-Reinhardt Kropp on May 14, 2004.

FIELD OF THE INVENTION

The invention relates to an optoelectronic coupling arrangement for a number of optical channels and also to a transceiver with such an optoelectronic coupling arrangement. In particular, the invention relates to an optoelectronic coupling arrangement which can be coupled to an optical MT-RJ connector.

BACKGROUND OF THE INVENTION

The MT-RJ connector is a relatively new optical small-form-factor (SFF) connector, which is used for coupling light in optoelectronic transceivers. It comprises two optical waveguides being arranged 750 µm apart in a conductor pin, which permits a compact plug-in arrangement.

DE 197 42 895 A1 describes an optoelectronic coupling arrangement in which two closely adjacent optical channels are brought a greater distance apart by a combination of lenses and mirrors, in order to couple them with two optoelectronic transducers arranged in a package. Such an arrangement is suitable for example for being used in combination with MT-RJ connectors.

It is known from DE 197 11 138 A1 to encapsulate active optical elements, such as laser diodes and photodiodes for example, in transparent plastic. In this case it may be envisaged to integrate lenses or mechanical guiding elements in the transparent plastic.

Furthermore, it is generally known to encapsulate active optical elements, such as laser diodes and photodiodes for example, in a plastic package, which is known in its basic construction from the encapsulation of purely electronic components. Known package standards are for example TSSOP10 (Thin Shrink Small Outline Package) or VQFN (Very Thin Profile Quad Flat Non Leaded Package).

There is a need for optoelectronic coupling arrangements for a number of optical channels and also associated optoelectronic transceivers which are distinguished by a high degree of electrical, optical and mechanical integration of the individual components, a small size and low-cost production.

SUMMARY OF THE INVENTION

The present invention is directed to an optoelectronic coupling arrangement which has: a package with electrical terminals, integrated in which are at least one optoelectronic transmitting component and at least one optoelectronic receiving component, which are encapsulated in the package with a non-transparent casting material; and an optomechanical coupling block, which consists of a transparent plastic and integrated in which are mechanical aligning means for attaching an optical connector. In this case, the optomechanical coupling block is connected to the package and at least two optical channels are provided in the package and the optomechanical coupling block for coupling light on the one hand between the at least one optoelectronic transmitting component and an optical connector to be attached, and on the other hand between the at least one optoelectronic receiving component and an optical connector to be attached.

Accordingly, the present invention is distinguished by the idea of providing a substantially two-part configuration of the coupling arrangement. A package—generally a standard package known from electronics—with encapsulated optical components, and an optomechanical coupling block, with integrated mechanical aligning means and optical imaging elements, are provided. These two parts are produced separately and then firmly connected to each other, for example by adhesive bonding.

The solution according to the invention has the advantage that on the one hand the optical components (transmitting component and receiving component) can be mounted in a precisely defined fixed spacing in a standard package. In this case, the packaging experience and the reliability and low costs from the production and packaging of electronic components can be used. This package is then combined with an optomechanical coupling block which can be produced at low cost from transparent plastic. The optomechanical coupling block may in this case have for example different thermal characteristics than the non-transparent casting material of the package. The latter generally has a low coefficient of thermal expansion, in order to prevent tension on bonding wires and other electrical connections in the package when there are changes in temperature. The optomechanical coupling block on the other hand consists of a transparent plastic which generally has a higher coefficient of thermal expansion. The coupling block may in this case be adapted in its properties (for example abrasion resistance and temperature resistance) to the respective application.

On account of the high degree of integration of its components and on account of the two-part construction, the coupling arrangement according to the invention provides a compact and low-cost solution.

In a preferred configuration, the optomechanical coupling block is formed in one piece. This entails simple production, for example as an injection molding.

Optical imaging elements, which shape light of the optical channels, are preferably integrated in the optomechanical coupling block. These elements are, in particular, lenses. To provide the optical channels, the optomechanical coupling block preferably has clearances. For example, a lens is respectively integrated in the clearances as an optical imaging element.

On its boundary surface with respect to the package of the coupling arrangement, the optomechanical coupling block preferably forms projections which correspond to openings in the package of the coupling arrangement. The projections allow simple passive alignment of the coupling block with respect to the package.

Furthermore, it is preferably envisaged that the optomechanical coupling block provides on its boundary surface with respect to the package of the coupling arrangement at least one partly reflecting boundary surface, which reflects some of the light that falls on it. In one configuration, the partly reflective boundary surface is in this case provided by a sloping optical entry surface of the optomechanical block. In another configuration, the partly reflective boundary surface is provided by a curved optical entry surface of the optomechanical block. The reflected light is passed for example to a monitor diode, which is assigned to a transmitting component for monitoring purposes.

In a preferred embodiment of the invention, the at least one transmitting component and the at least one receiving component are arranged on a carrier substrate. Such a carrier substrate is also referred to as a submount. It serves both for mechanically fastening the components and for electrically contacting them.

It is preferably provided in this case that the carrier substrate is transparent to the light emitted and received and the at least one transmitting component and the at least one receiving component are arranged on the side of the carrier substrate that is facing away from the coupling block.

The components may be connected to the carrier substrate (submount) by adhesive attachment and wire bonding. However, flip-chip mounting on the carrier substrate is preferred. In this case, the components are arranged on the carrier substrate with the upper side down. Both electrical contacts of the components are formed on the upper side, i.e. on the side of the component that is facing the carrier substrate. In the case of flip-chip mounting, the soldered connections between the component and the carrier substrate establish both a mechanical connection and an electrical connection between the component and the carrier substrate.

In a further preferred configuration, a partly reflecting boundary surface is integrated in the carrier substrate. The reflected light is passed for example to a monitor diode, which is assigned to a transmitting component for monitoring purposes.

In one configuration of the invention, the optomechanical coupling block is connected directly to the one side of the carrier substrate that is freely accessible on the package surface.

In a further preferred configuration, the carrier substrate is arranged on a leadframe and the light emitted and received enters the optomechanical coupling block and leaves it through the leadframe.

In this case, the leadframe has openings in the region of the optical channels of the coupling arrangement. If a leadframe is provided, the optomechanical coupling block is preferably connected to the leadframe.

The arrangement preferably has in addition at least one monitor component, which is respectively assigned to a transmitting component. The monitor component is in this case preferably arranged along with the transmitting component on the carrier substrate. The light reflected at a partly reflecting boundary surface is in this case passed to the monitor component. However, the latter may also be alternatively arranged above or below a vertically emitting transmitting component.

The transmitting component is preferably formed as a vertically emitting laser component (VCSEL). The receiving component is preferably formed as a photodiode. Both are preferably formed as a prefabricated chip which is mounted on the submount.

The invention also relates to an optoelectronic transceiver which has: an optoelectronic coupling arrangement as set forth above, a circuit carrier, on which the coupling arrangement is arranged and by which it is electrically contacted, and a package with a package wall and at least one receiving opening for receiving and attaching an optical connector. In this case, the coupling arrangement and the circuit carrier are arranged in the package.

The circuit carrier is preferably formed as a flexible conductor. Flexible conductors have conductor patterns which are integrated in a flexible substrate. In this case, it is preferably provided that the flexible conductor is bent by approximately 90° in the package and has a first region, which is aligned perpendicularly in relation to the mounting direction and carries the coupling arrangement, and a second region, which is aligned parallel to the mounting direction and serves for the arrangement on a main circuit board. The circuit carrier is in this case preferably freely accessible on the underside of the package, so that mounting and contacting on a main circuit board are possible in a simple way.

The package wall preferably has structures for receiving and aligning the coupling arrangement.

BRIEF DESCRIPTION OF THE DRAWINGS

The invention is explained in more detail below on the basis of several exemplary embodiments with reference to the figures, in which.

DESCRIPTION OF SEVERAL PREFERRED EXEMPLARY EMBODIMENTS

Figure 1:
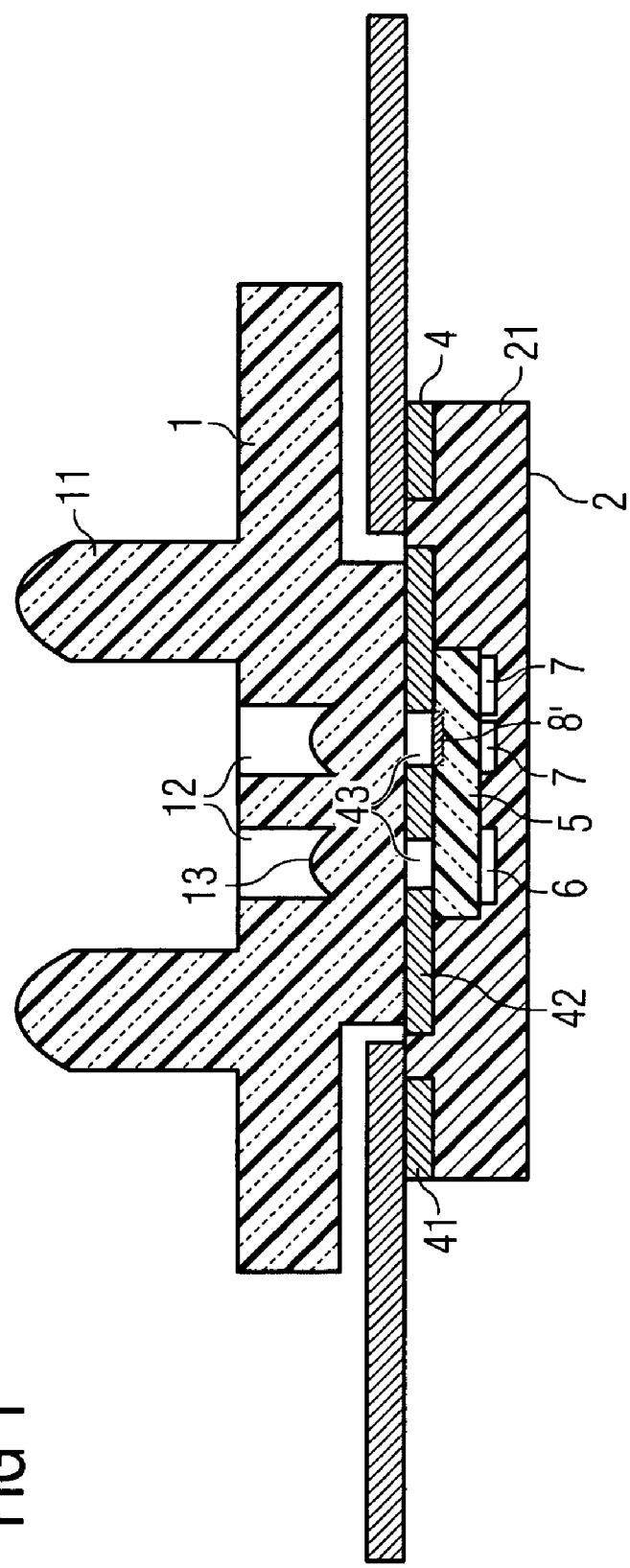
FIG. 1 shows a first exemplary embodiment of a two-part coupling arrangement comprising an optomechanical coupling block and a package with encapsulated optical elements, the coupling arrangement having two adjacent optical channels.

FIG. 1 shows a two-part coupling arrangement, which comprises an optomechanical coupling block 1 and a package 2 connected to the coupling block 1. The coupling block 1 consists of a transparent plastics material and is produced for example as an injection molding. The coupling block 1 has on the one hand mechanical aligning elements, which are formed for example as pins 11. On the other hand, two adjacent optical channels are provided in the coupling block 1 by clearances (openings) 12 and beam-shaping surfaces 13 formed in the clearances 12. The clearances 12 may in this case serve for example for receiving optical waveguides respectively arranged in a ferrule.

The package 2 comprises a leadframe 4, a carrier or submount 5 arranged on the leadframe, a photodiode 6 and a laser diode 7. All the components are encased by a non-transparent casting material 21 with a low coefficient of expansion. In a way known per se, the leadframe 4 has a plurality of contact regions (leads) 41, which extend along the periphery of the leadframe 4. Furthermore, the leadframe 4 centrally has a carrier area (die pad) 42, on which the submount 5 is arranged.

The submount 5 is transparent both to the light detected by the photodiode 6 and to the light emitted by the laser diode 7. The submount consists for example of a silicon substrate or glass. The laser diode 7 is preferably a vertically emitting laser diode, which is mounted on the submounts with the upper side down (upside down) by flip-chip mounting. Similarly, the photodiode 6 is preferably also arranged on the submount 5 by flip-chip mounting. The light emitted and received consequently passes through the submount 5.

If the submount 5 is not transparent to the light emitted and/or received, it is alternatively conceivable to form clearances in the submount.

Formed in the carrier area 42 of the leadframe 4 are two openings 43, which permit the passage of light, of the light emitted by the laser diode 7 or the light received by the photodiode 6, through the leadframe. They correspond in their position exactly to the clearances 12 in the optomechanical coupling block 1, so that the two clearances 12, 43 with the associated optical elements 6, 7 provide two adjacent optical channels in the coupling arrangement.

If there are more than two components 6, 7, more than two optical channels can also be realized in a corresponding way.

Figure 6:
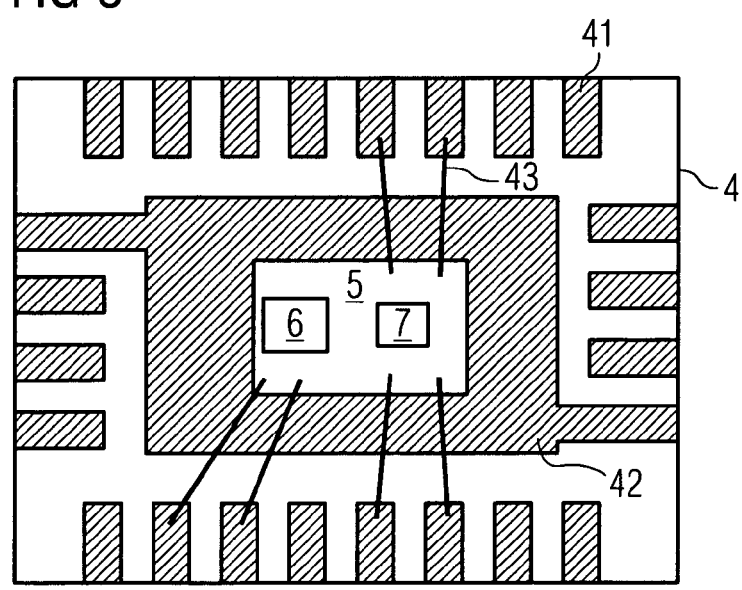
FIG. 6 shows in a plan view a leadframe of a coupling arrangement as shown in FIGS. 1 to 3, a photodiode and a laser diode being arranged and contacted on the leadframe.

Electrical contacting of the photodiode 6 and of the laser diode 7 is schematically represented in FIG. 6, which shows the leadframe 4 with the leads 41 and the die pad 42 in a plan view from the underside of the package 2. Bonding wires 43 are led from some of the leads 41 to contact pads (not represented) on the upper side of the submount 5. In a way known per se, these contact pads provide an electrical contact with corresponding contact regions of the photodiode 6 and laser diode 7, arranged by flip-chip mounting, by means of metallizations that are not represented. It could similarly be envisaged to provide additional bonding wires for the contacting of the photodiode 6 and the laser diode 7, and if appropriate also of further components arranged on the submount 5.

The leads 41 of the leadframe 4 are connected as shown in FIG. 1 to contact regions that are not represented of a circuit carrier 3, which is for example a printed circuit board or a flexible conductor. The fastening of the arrangement and contacting of the leads 41 on a flexible conductor is particularly preferred in this case. The leads 41 are in this case connected for example by means of soldering to conductor tracks of the circuit carrier 3.

The production of the coupling arrangement according to FIG. 1 takes place by the package 2 with the optical elements 6, 7 encapsulated in it and the optomechanical coupling block 1 respectively being produced separately. The package 2 in this case preferably corresponds largely to a standard electronic package. This provides a compact arrangement of the optical elements together with low-cost encapsulation, it being possible for production to take place in large numbers of repeats. In an advantageous way, the optical elements 6, 7 are first mounted together on the submount 5 with high positioning accuracy. For this purpose, known mass production devices can be used for the mounting. A gap which is present between the optical chip 6, 7 and the submount 5 is filled by a transparent casting compound before the encapsulation with the plastics material 21, whereby the optically used regions are protected from being penetrated by the plastics material 21. Arrangement on the leadframe 4 and encasing with the non-transparent plastic 21 subsequently take place. The package 2 with the encapsulated components 6, 7 represents a finished unit that can undergo testing.

The optomechanical coupling block 1, likewise formed as a separate part, is placed on the package, to be precise on the side of the leadframe that is facing away from the submount 5. An adjustment subsequently takes place, by the clearances 12 being aligned exactly over the clearances 43 of the leadframe and on the optical axis of the optical elements 6, 7. The coupling block is subsequently fixed with respect to the package, for example by adhesive bonding.

A monitor diode, which detects some of the light emitted by the laser diode 7 for monitoring purposes, is additionally optionally integrated in the package 1. In a first configurational variant, such a monitor diode is mounted directly on the submount 5 or integrated in it. This is schematically represented in FIG. 1 by the monitor diode 8' that is represented by dashed lines. The monitor diode 8' is passed through by the laser light emitted by the laser diode 7 and some of the radiation is absorbed for monitoring. A technical solution in the case of an emitted radiation of 850 nm is, for example, that the photodiode is provided on an SOI (Silicon on Isolator) substrate, for example a glass wafer with a thin silicon layer, alternatively on a sapphire wafer with a silicon layer, the photodiode being realized on the silicon layer.

Figure 2:
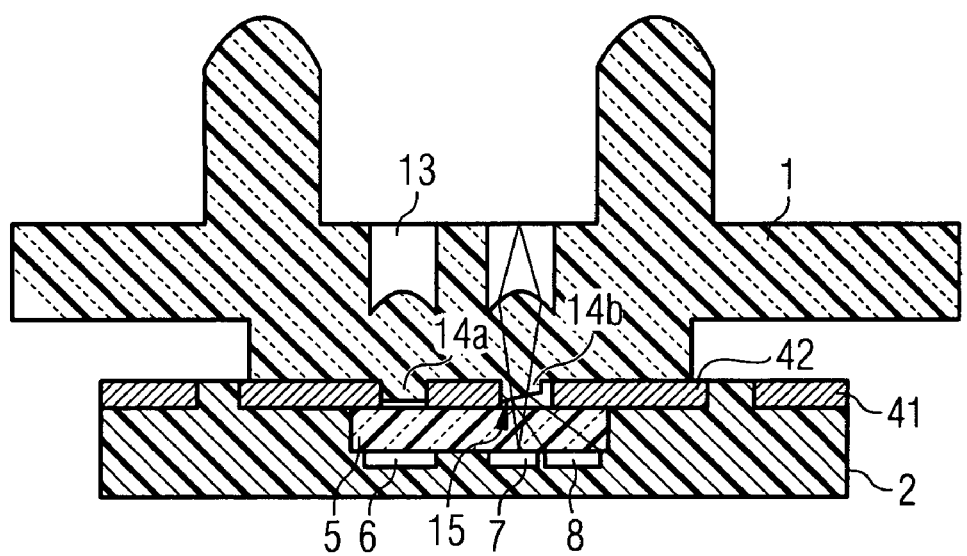
FIG. 2 shows a first alternative configuration of a coupling arrangement, a laser diode and a monitor diode being integrated in the package, and the optomechanical coupling block having a sloping, partly reflective boundary surface for the reflection of some of the light of the laser diode onto the monitor diode.
Figure 3:
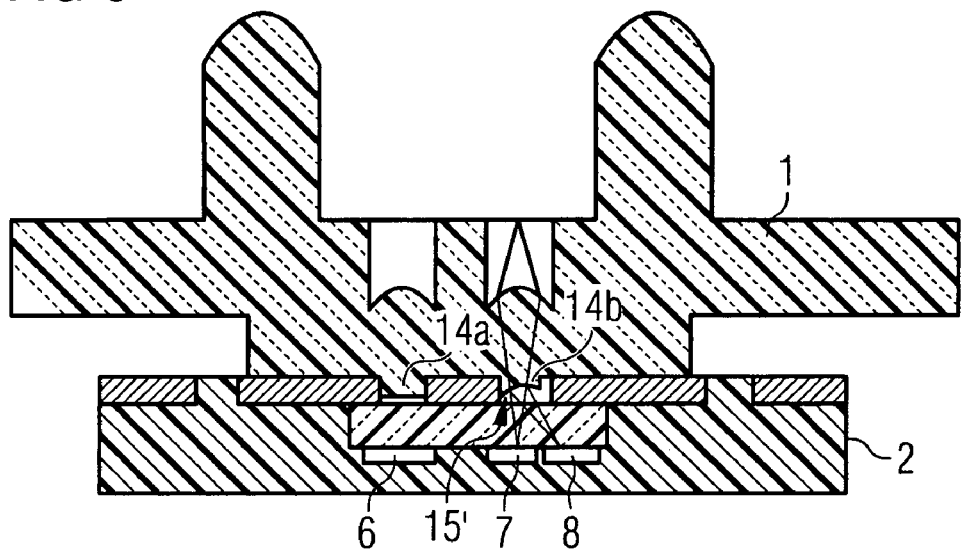
FIG. 3 shows a second alternative configuration of a coupling arrangement, a laser diode and a monitor diode being integrated in the package, and the optomechanical coupling block having a curved, partly reflective boundary surface for the reflection of some of the light of the laser diode onto the monitor diode.

FIGS. 2 and 3 show alternative configurations, in which the photodiode 8 is arranged along with the laser diode on the transparent substrate 5.

In the exemplary embodiment of FIG. 2, the optomechanical coupling block 1 has two projections 14a, 14b, which protrude into the openings 43 of the leadframe. These openings on the one hand permit passive adjustment of the coupling block 1 with respect to the package 2. Furthermore, they permit the realization of an optical functional area for the partial reflection of the radiation emitted by the laser diode 7 onto the monitor diode 8. In the exemplary embodiment of FIG. 2 it is envisaged in this case to provide in the one projection 14d a sloping, partly reflective entry surface of the optomechanical block 1. In the exemplary embodiment of FIG. 3, this partly reflective boundary or entry surface is curved. In both cases, some of the light which is emitted by the laser diode 7 is reflected onto the monitor diode 8.

Figure 4:
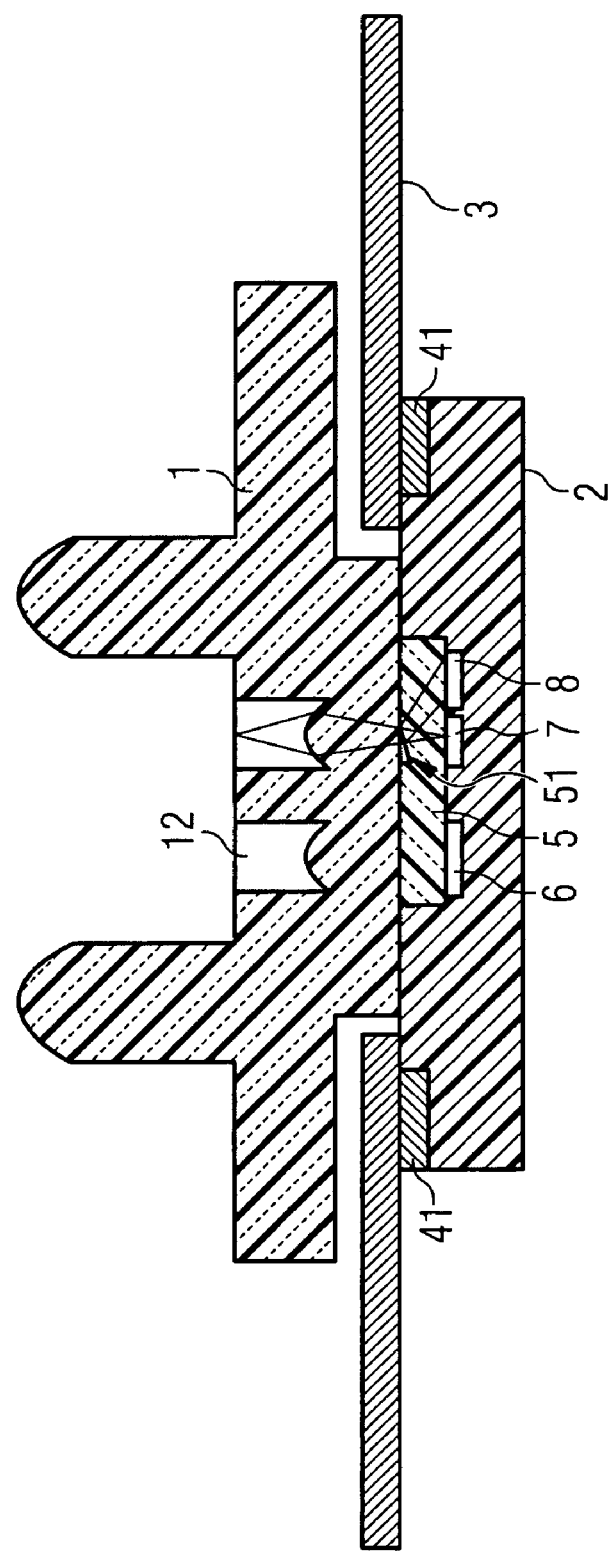
FIG. 4 shows a third alternative configuration of a coupling arrangement, a beam-shaping surface being integrated in a submount that is integrated in the package.

In the exemplary embodiment of FIG. 4, the leadframe does not have a central carrier area, but merely comprises contact regions 41. The contact regions 41 may in principle also be formed in some other way than by a leadframe. The side of the submount 5 that is facing away from the optical elements 6, 7, 8 represents the boundary surface of the package 2, i.e. the submount is completely accessible from one side. On this side, the optomechanical coupling block 1 is placed directly on the submount 5 and connected for example by adhesive bonding.

In this case it may be provided, as represented in FIG. 4, that a partly reflective boundary surface 51 is integrated in the submount 8 itself for the reflection of some of the light emitted by the transmitting diode 7 onto the monitor diode 8. In the exemplary embodiment of FIG. 4, this boundary surface is structured in the rear side of the submount 5.

It is pointed out that, in the exemplary embodiments represented, along with the submount 5 with the optical components 6, 7, 8, it is also possible for further electronic chips, such as for example a laser driver or amplifier for the photodiode, to be integrated in the package 2. This further increases the compactness of the arrangement and the compression of the functions.

Figure 5:
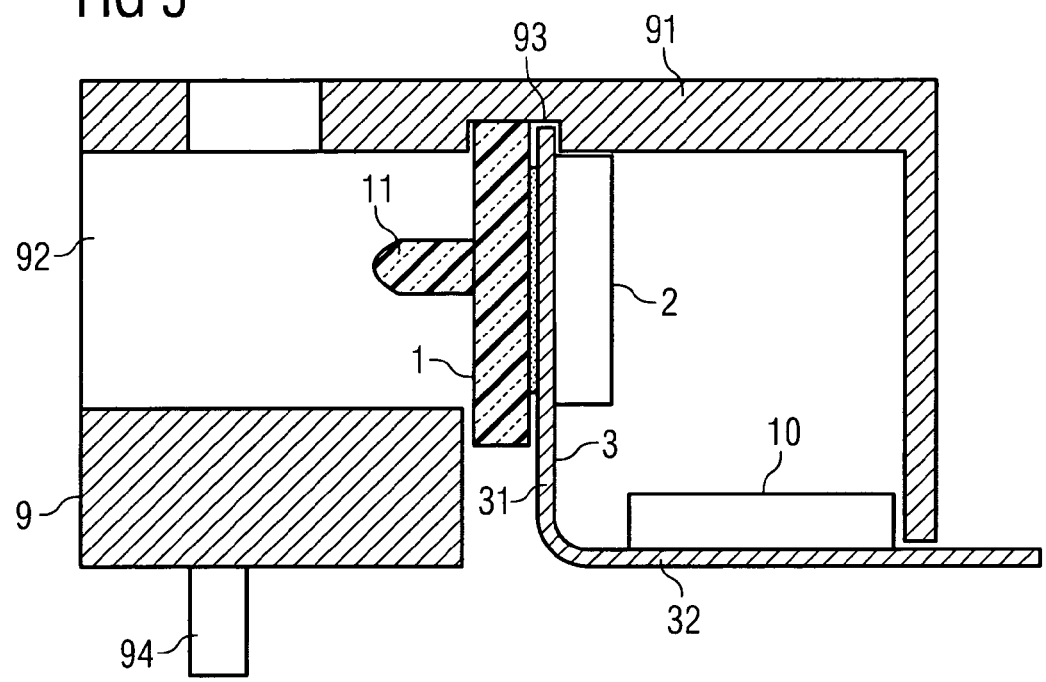
FIG. 5 shows in a partly sectioned view a coupling arrangement as shown in FIGS. 1 to 4, arranged in a transceiver package.

Represented in FIG. 5 is a transceiver 9, in which a coupling arrangement as shown in FIGS. 1 to 4 is integrated. The coupling arrangement with the package 2 and the coupling block 1 is in this case mounted on a circuit carrier 3, which is for example a flexible conductor. As represented in FIG. 1, the electrical contacts 41 of the coupling arrangement are in this case connected to conductor tracks (not represented) of the circuit carrier or flexible conductor 3.

After the package 1 has been mounted on the circuit carrier 3, the optomechanical block 1 is mounted on the package 1, for example by adhesive bonding. In this operation, the optically used regions between the package and the optomechanical coupling block 1 are preferably completely filled with a transparent casting compound or an optically transparent adhesive. This also serves as an adaptation of the refractive index in relation to the optomechanical coupling block 1 and is advantageous in particular whenever the optical entry region into the optomechanical coupling block is provided with a sloping or curved surface to realize the monitor function, as shown in FIGS. 2 and 3.

Further active or passive electronic components 10, which are schematically represented in FIG. 5, may be mounted on the circuit carrier 3.

In a preferred configuration, a flexible conductor which is bent by about 90 degrees is used. A first region 31 of the flexible conductor in this case runs perpendicularly in relation to the mounting plane of the module, a second region 32 of the flexible conductor runs parallel to the mounting plane of the module. The transceiver 9 has a wall 91 with clearances 93 for mechanically receiving and aligning the coupling arrangement 1, 2 and also a receiving opening 92 for an optical connector to be attached. The region 32 of the flexible conductor 3 that runs parallel to the mounting plane of the module is accessible from the underside, so that the entire transceiver can be arranged on a main circuit board and contacted by SMD mounting. The alignment pin 94 serves in this case for the mechanical alignment of the transceiver on such a main circuit board.

The invention is not restricted in its configuration to the exemplary embodiments represented above. For example, lasers other than vertically emitting lasers may also be provided, for example edge emitting lasers, with a deflecting device then additionally being provided for the deflection of the emitted light. A person skilled in the art appreciates the existence of numerous alternative configurational variants which, in spite of their departure from the exemplary embodiments described, make use of the teaching defined in the claims which follow.

I claim:

1. An optoelectronic coupling arrangement comprising:
   a package with electrical terminals, wherein the package includes:
      at least one optoelectronic transmitting component, and
      at least one optoelectronic receiving component,
      wherein the at least one optoelectronic transmitting component and the at least one optoelectronic receiving component are encapsulated in the package with a non-transparent casting material; and
   an optomechanical coupling block comprising a transparent plastic and including mechanical aligning means for attaching an optical connector, wherein the optomechanical coupling block is formed in one piece;
   wherein the optomechanical coupling block is connected to the package, and
   wherein the package and the optomechanical coupling block cooperatively define at least two optical channels including a first optical channel for coupling light between the at least one optoelectronic transmitting component and the optical connector to be attached, and a second optical channel for coupling light between the at least one optoelectronic receiving component and the optical connector to be attached.

2. The arrangement as claimed in claim 1, wherein the optomechanical coupling block further comprises optical imaging elements.

3. The arrangement as claimed in claim 1, wherein the optomechanical coupling block defines clearances which serve for the provision of the at least two optical channels.

4. The arrangement as claimed in claim 3, further comprising first and second lenses respectively integrated in the clearances as an optical imaging element.

5. The arrangement as claimed in claim 1, wherein the optomechanical coupling block includes on its boundary surface with respect to the package of the coupling arrangement projections which correspond to openings in the package of the coupling arrangement, and which permit passive alignment of the coupling block with respect to the package.

6. The arrangement as claimed in claim 1, wherein the optomechanical coupling block provides on its boundary surface with respect to the package of the coupling arrangement at least one partly reflecting boundary surface, which reflects some of the light that falls on it.

7. The arrangement as claimed in claim 6, wherein the partly reflective boundary surface is provided by a sloping optical entry surface of the optomechanical block.

8. The arrangement as claimed in claim 6, wherein the partly reflective boundary surface is provided by a curved optical entry surface of the optomechanical block.

9. The arrangement as claimed in claim 1, wherein the at least one transmitting component and the least one receiving component are arranged on a carrier substrate.

10. The arrangement as claimed in claim 9, wherein the carrier substrate is transparent to the light emitted and received, and the at least one transmitting component and the at least one receiving component are arranged on the side of the carrier substrate that is facing away from the coupling block.

11. The arrangement as claimed in claim 10, wherein the at least one transmitting component and the at least one receiving component are arranged on the carrier substrate by flip-chip mounting.

12. The arrangement as claimed in claim 9, wherein a partly reflecting boundary surface is integrated in the carrier substrate.

13. The arrangement as claimed in claim 9, wherein the optomechanical coupling block is connected to the carrier substrate.

14. The arrangement as claimed in claim 9, wherein the carrier substrate is arranged on a leadframe and the light emitted and received entering the optomechanical coupling block and leaving it through the leadframe.

15. The arrangement as claimed in claim 14, wherein the leadframe defines openings in the region of the optical channels of the coupling arrangement.

16. The arrangement as claimed in claim 14, wherein the optomechanical coupling block is connected to the leadframe.

17. The arrangement as claimed in claim 1, further comprising at least one monitor component, which is respectively assigned to a transmitting component.

18. The arrangement as claimed in claim 17, wherein the monitor component is arranged along with the transmitting component on the carrier substrate.

19. The arrangement as claimed in claim 6, wherein the light reflected at the partly reflecting boundary surface is passed to the monitor component.

20. The arrangement as claimed in claim 1, wherein the transmitting component comprises a vertically emitting laser component.

21. The arrangement as claimed in claim 1, wherein the receiving component comprises a photodiode.

22. The arrangement as claimed in claim 1, wherein the first optical channel couples light between one of the at least one optoelectronic transmitting component and a first waveguide and the second optical channel couples light between one of the at least one optoelectronic receiving component and a second waveguide.

23. The arrangement as claimed in claim 3, wherein the clearances are configured to receive optical waveguides respectively arranged in a ferrule.

24. An optoelectronic transceiver comprising:
an optoelectronic coupling arrangement including:
a package with electrical terminals, wherein the package includes:
at least one optoelectronic transmitting component, and
at least one optoelectronic receiving component,
wherein the at least one optoelectronic transmitting component and the at least one optoelectronic receiving component are encapsulated in the package with a non-transparent casting material; and
an optomechanical coupling block comprising a transparent plastic and including mechanical aligning means for attaching the optical connector,
wherein the optomechanical coupling block is connected to the package, and
wherein the package and the optomechanical coupling block cooperatively define at least two optical channels including a first optical channel for coupling light between the at least one optoelectronic transmitting component and an optical connector to be attached, and a second optical channel for coupling light between the at least one optoelectronic receiving component and the optical connector to be attached,
a circuit carrier, on which the coupling arrangement is arranged and by which it is electrically contacted, and
a package with a package wall and at least one receiving opening for receiving and attaching the optical connector, wherein the coupling arrangement and the circuit carrier are arranged in the package.

25. The transceiver as claimed in claim 24, wherein the circuit carrier comprises a flexible conductor.

26. The transceiver as claimed in claim 25, wherein the flexible conductor is bent by approximately 90° in the package and has a first region, which is aligned perpendicularly in relation to the mounting direction and carries the coupling arrangement, and a second region, which is aligned parallel to the mounting direction and serves for the arrangement on a main circuit board.

27. The transceiver as claimed in claim 24, wherein the circuit carrier is freely accessible on the underside of the package.

28. The transceiver as claimed in claim 24, wherein the package wall forms structures for receiving and aligning the coupling arrangement.

* * * * *

UNITED STATES PATENT AND TRADEMARK OFFICE
CERTIFICATE OF CORRECTION

PATENT NO.       : 7,364,368 B2                                                                 Page 1 of 1
APPLICATION NO.  : 11/035789
DATED            : April 29, 2008
INVENTOR(S)      : Kropp It is certified that error appears in the above-identified patent and that said Letters Patent is hereby corrected as shown below:

<u>Col. 6</u>
Line 30 change "14d" to --14b--

<u>Col. 8</u>
Line 25 change "least one receiving" to --at least one receiving--

Signed and Sealed this

Nineteenth Day of October, 2010

David J. Kappos
*Director of the United States Patent and Trademark Office*